(12) United States Patent
Song

(10) Patent No.: US 10,739,408 B2
(45) Date of Patent: Aug. 11, 2020

(54) DIAGNOSTIC APPARATUS AND POWER SYSTEM INCLUDING THE SAME

(71) Applicant: LG CHEM, LTD., Seoul (KR)

(72) Inventor: Jeong-Joo Song, Daejeon (KR)

(73) Assignee: LG CHEM, LTD., Seoul (KR)

( * ) Notice: Subject to any disclaimer, the term of this patent is extended or adjusted under 35 U.S.C. 154(b) by 125 days.

(21) Appl. No.: 16/076,421

(22) PCT Filed: Sep. 21, 2017

(86) PCT No.: PCT/KR2017/010408
§ 371 (c)(1),
(2) Date: Aug. 8, 2018

(87) PCT Pub. No.: WO2018/070684
PCT Pub. Date: Apr. 19, 2018

(65) Prior Publication Data
US 2019/0047436 A1    Feb. 14, 2019

(30) Foreign Application Priority Data
Oct. 10, 2016 (KR) .................. 10-2016-0130781

(51) Int. Cl.
*G01R 31/36* (2020.01)
*G01R 31/371* (2019.01)
(Continued)

(52) U.S. Cl.
CPC ............ *G01R 31/371* (2019.01); *B60L 50/50* (2019.02); *G01R 31/3277* (2013.01);
(Continued)

(58) Field of Classification Search
CPC .. G01R 31/371; G01R 31/50; G01R 31/3835; G01R 31/001; G01R 31/002;
(Continued)

(56) References Cited

U.S. PATENT DOCUMENTS 6,731,116 B2 * 5/2004 Yamamoto ............ B60L 3/0015
324/522
6,952,103 B2 * 10/2005 Herb ...................... G01R 27/18
324/500
(Continued)

FOREIGN PATENT DOCUMENTS

CN    101779133 A    7/2010
CN    201886083 U    6/2011
(Continued)

OTHER PUBLICATIONS

International Search Report (PCT/ISA/210) issued in PCT/KR2017/010408, dated Apr. 24, 2018.
(Continued)

*Primary Examiner* — Lee E Rodak
(74) *Attorney, Agent, or Firm* — Birch, Stewart, Kolasch & Birch, LLP

(57) ABSTRACT

Provided is a diagnostic apparatus for a power system. The power system comprises a battery assembly and at least one contactor. Each of the at least one contactor is configured to selectively close or open a power supply path between the battery assembly and a load. The diagnostic apparatus is configured to execute one of a first diagnostic function of determining a current leakage of the battery assembly and a second diagnostic function of determining a short circuit of the at least one contactor while the other one is being executed.

15 Claims, 7 Drawing Sheets

(51) Int. Cl.
| | |
|---|---|
| *B60L 50/50* | (2019.01) |
| *G01R 31/327* | (2006.01) |
| *G08B 21/18* | (2006.01) |
| *G01R 31/50* | (2020.01) |
| *G01R 31/364* | (2019.01) |
| *G01R 31/00* | (2006.01) |
| *G01R 31/40* | (2020.01) |
| *B60L 3/00* | (2019.01) |

(52) U.S. Cl.
CPC ........... *G01R 31/364* (2019.01); *G01R 31/50* (2020.01); *G08B 21/18* (2013.01); *B60L 3/00* (2013.01); *B60Y 2200/91* (2013.01); *G01R 31/007* (2013.01); *G01R 31/40* (2013.01); *Y02T 10/7005* (2013.01)

(58) Field of Classification Search
CPC .. G01R 31/003; G01R 31/004; G01R 31/005; G01R 31/006; G01R 31/007; G01R 31/008; G01R 31/025; G01R 31/026; G01R 27/025; G01R 27/18; G01R 31/1272; G01R 31/362; G01R 31/086; G01R 31/14; G01R 31/3277; G01R 31/364; G01R 31/40; G01R 31/52; G01R 19/16542; G01R 15/04; G01R 15/002; G01R 1/0408; G08B 21/18; Y02T 10/7005; B60Y 2200/91; B60L 58/10; B60L 3/0069; B60L 50/50; B60L 3/00
See application file for complete search history.

(56) References Cited

U.S. PATENT DOCUMENTS

| | | | | |
|---|---|---|---|---|
| 2006/0006840 | A1* | 1/2006 | Furukawa | H02J 7/0021 320/116 |
| 2011/0084705 | A1* | 4/2011 | Kawamura | G01R 27/025 324/551 |
| 2011/0199223 | A1 | 8/2011 | Akimov et al. | |
| 2012/0262183 | A1 | 10/2012 | Kawamura | |
| 2013/0176041 | A1* | 7/2013 | Yang | G01R 27/025 324/691 |
| 2014/0095093 | A1* | 4/2014 | Hong | G01R 31/50 702/63 |
| 2014/0152318 | A1 | 6/2014 | Bertrand et al. | |
| 2015/0115972 | A1 | 4/2015 | Park | |
| 2015/0326065 | A1 | 11/2015 | Schaedlich | |
| 2015/0346257 | A1 | 12/2015 | Tabatowski-Bush | |
| 2016/0154064 | A1* | 6/2016 | Klein | G01R 31/3277 324/433 |
| 2016/0200209 | A1* | 7/2016 | Tabatowski-Bush | B60L 50/16 701/22 |

FOREIGN PATENT DOCUMENTS

| | | |
|---|---|---|
| CN | 102269790 A | 12/2011 |
| CN | 102735983 A | 10/2012 |
| CN | 102830351 A | 12/2012 |
| CN | 102866353 A | 1/2013 |
| CN | 203761018 U | 8/2014 |
| CN | 105785272 A | 7/2016 |
| DE | 102011004516 A1 | 8/2012 |
| JP | 2008-139249 A | 6/2008 |
| JP | 2014-048050 A | 3/2014 |
| JP | 2014-61267 A | 5/2014 |
| JP | 2015-518141 A | 6/2015 |
| KR | 10-2009-0024573 A | 3/2009 |
| KR | 10-2014-0089481 A | 7/2014 |
| KR | 10-1504274 B1 | 3/2015 |
| KR | 10-2016-0054935 A | 5/2016 |

OTHER PUBLICATIONS

Seip, "Manual of the Technics of Electrical Installing,", Publicis Corporate Publishing, 4th revised edition, ISBN: 7-112-04808-7, 2000, pp. 397 (total 4 pages), with an English abstract.

* cited by examiner

DIAGNOSTIC APPARATUS AND POWER SYSTEM INCLUDING THE SAME

TECHNICAL FIELD

The present application claims priority to Korean Patent Application No. 10-2016-0130781 filed on Oct. 10, 2016 in the Republic of Korea, the disclosure of which is incorporated herein by reference.

The present disclosure relates to a diagnostic apparatus and a power system including the same, and more particularly, to an apparatus for diagnosing a current leakage accident and a short circuit accident generated in a power system, and the power system including the apparatus.

BACKGROUND ART

Recently, according to rapid increase in demands for portable electronic products, such as laptop computers, video cameras, portable phones, etc. and earnest development of electric cars, storage batteries for energy storage, robots, satellites, etc., studies of high performance secondary batteries capable of repetitive charging and discharging are actively conducted.

Currently commercialized secondary batteries are nickel cadmium batteries, nickel hydrogen batteries, nickel zinc batteries, lithium secondary batteries, etc. and the lithium secondary batteries thereamong are receiving attention according advantages of free charging/discharging, a very low self-discharge rate, and high energy density since a memory effect is barely generated compared to nickel-based secondary batteries.

Meanwhile, a power system is essential in various apparatuses that require electric energy, such as electric cars. The power system is in charge of stable power supply between a battery and a load by selectively closing or opening at least one contactor.

In relation to safety of the power system, it is required to diagnose generation of largely two types of accidents. One is a current leakage accident of a battery and the other one is a short circuit accident of a contactor. When the current leakage accident is generated, a user has a risk of getting an electric shock or the like, and when the short circuit accident is generated, there is a risk of sudden unintended acceleration or the like.

A conventional art for diagnosing the current leakage accident and a conventional art for diagnosing a short circuit accident have been easy disclosed, but a conventional art for simultaneously diagnosing two types of accidents is not disclosed.

A critical safety problem may be generated if the current leakage accident and the short circuit accident are not simultaneously diagnosed. For example, when a diagnosis of the short circuit accident begins after a diagnosis of the current leakage accident is completed, generation of the short circuit accident cannot be quickly notified to a user.

DISCLOSURE

Technical Problem

The present disclosure is designed to solve the above problems, and therefore the present disclosure is directed to providing a diagnostic apparatus capable of executing a second diagnostic function of determining a short circuit of at least one contactor while a first diagnostic function of determining a current leakage of a battery module is being executed, or capable of executing the first diagnostic function while the second diagnostic function is being executed, and a power system including the diagnostic apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure for achieving the objectives are as follows.

In one aspect of the present disclosure, there is provided a diagnostic apparatus for a power system that includes a battery assembly, a first contactor, a second contactor, a first protection capacitor, and a second protection capacitor. The diagnostic apparatus includes: a first voltage dividing unit connected between a ground of the power system and a first node to which a positive electrode of the battery assembly and one end of the first contactor are commonly connected, and configured to generate a first detection voltage by dividing a voltage applied between the first node and the ground; a second voltage dividing unit connected between the ground and a second node to which a negative electrode of the battery assembly and one end of the second connector are commonly connected, and configured to generate a second detection voltage by dividing a voltage applied between the second node and the ground; a third voltage dividing unit connected between the second node and a third node to which one end of the first protection capacitor and another end of the first contactor are commonly connected, and configured to generate a third detection voltage by dividing a voltage between the third node and the second node; and a control unit configured to control the first contactor, the second contactor, and the first through third voltage dividing units. The control unit may be configured to execute a first diagnostic function and a second diagnostic function during an inactive section where the first contactor and the second contactor are controlled in an opened state. The first diagnostic function may be a function of determining a current leakage of the battery assembly based on the first detection voltage and the second detection voltage, and the second diagnostic function may be a function of determining a short circuit of at least one of the first contactor and the second contactor based on the third detection voltage.

The first voltage dividing unit may include: a first voltage divider configured to divide a voltage applied between the first node and the ground, and including a first protection resistor and a first detection resistor; and a first switch configured to selectively apply the voltage applied between the first node and the ground to the first voltage divider, in response to a signal output from the control unit. Also, the second voltage dividing unit may include: a second voltage divider configured to divide a voltage applied between the second node and the ground, and including a second protection resistor and a second detection resistor; and a second switch configured to selectively apply the voltage applied between the second node and the ground to the second voltage divider, in response to a signal output from the control unit. In this case, the first detection resistor may generate the first detection voltage when the first switch is in a closed state, and the second detection resistor may generate the second detection voltage when the second switch is in a closed state.

The third dividing unit may include: a third voltage divider configured to divide a voltage applied between the third node and the second node, and including a third protection resistor and a third detection resistor; and a third switch configured to selectively apply the voltage applied between the third node and the second node to the third voltage divider, in response to a signal output from the control unit. In this case, the third detection resistor may generate the third detection voltage when the third switch is in a closed state.

Together or separately, the inactive section may include a first switching cycle in which the first switch and the third switch are controlled in a closed state, and the second switch is controlled in an opened state. The control unit may be configured to record a first pattern including values of the third detection voltage measured a plurality of times according to time during the first switching cycle, and determine a short circuit of the first contactor based on the first pattern.

Together or separately, the inactive section may include a second switching cycle in which the first switch is controlled in an opened state, and the second switch and the third switch are controlled in a closed state. The control unit may be configured to record a second pattern comprising values of the third detection voltage measured a plurality of times according to time during the second switching cycle, and determine a short circuit of the second contactor based on the second pattern.

According to an embodiment, the inactive section may include: a first switching cycle in which the first switch and the third switch are controlled in a closed state, and the second switch is controlled in an opened state; and a second switching cycle in which the first switch is controlled in an opened state, and the second switch and the third switch are controlled in a closed state. The control unit may be configured to determine that the first contactor and the second contactor are in a normal state when the third detection voltage is gradually decreased while having a positive value during the first switching cycle, and is gradually increased while having a negative value during the second switching cycle. Meanwhile, the control unit may be configured to determine that the first contactor and the second contactor are short-circuited due to malfunction when a value of the third detection voltage is maintained constant during the first switching cycle or the second switching cycle.

Together or separately, the control unit may include: a microprocessor; a multiplexer configured to select at least one of the first to third detection voltages, in response to a signal provided from the microprocessor; and an analog-digital converter (ADC) configured to convert a detection voltage selected by the multiplexer to a digital signal and transmit the digital signal to the microprocessor.

Preferably, another end of each of the first protection capacitor and the second protection capacitor may be commonly connected to the ground.

In another aspect of the present disclosure, there is also provided a power system including the diagnostic apparatus.

In another aspect of the present disclosure, there is also provided an electric car including the power system.

Advantageous Effects

According to at least one of embodiments of the present disclosure, a second diagnostic function of determining a short circuit of at least one contactor may be executed while a first diagnostic function of determining a current leakage of a battery module is being executed, or the first diagnostic function may be executed while the second diagnostic function is being executed. Accordingly, information about generation of a current leakage accident and a short circuit accident may be quickly notified to a user.

Effects of the present disclosure are not limited by the effects described above, and other effects that are not mentioned will become apparent to one of ordinary skill in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Also, in the description of the present disclosure, detailed explanations of related well-known configurations or functions may be omitted when it is deemed that they may obscure the essence of the disclosure.

Throughout the specification, when a part "includes" a component, unless there is a particular description contrary thereto, the part can further include other components, not excluding the other components. In the following description, terms such as <control unit> indicate a unit for processing at least one function or operation, wherein the control unit may be embodied as hardware or software or embodied by combining hardware and software.

In addition, throughout the specification, when a region is "connected" to another region, the regions may not only be "directly connected", but may also be "indirectly connected" via another device therebetween.

Figure 1:
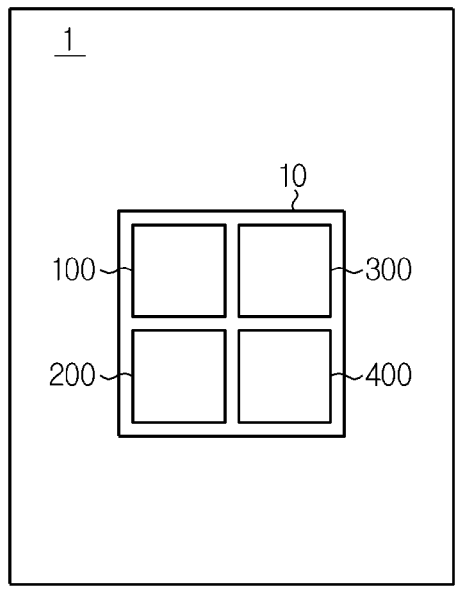
FIGS. 1 and 2 are block diagrams schematically illustrating a functional configuration of a power system and a diagnostic apparatus, according to an embodiment of the present disclosure.
Figure 2:
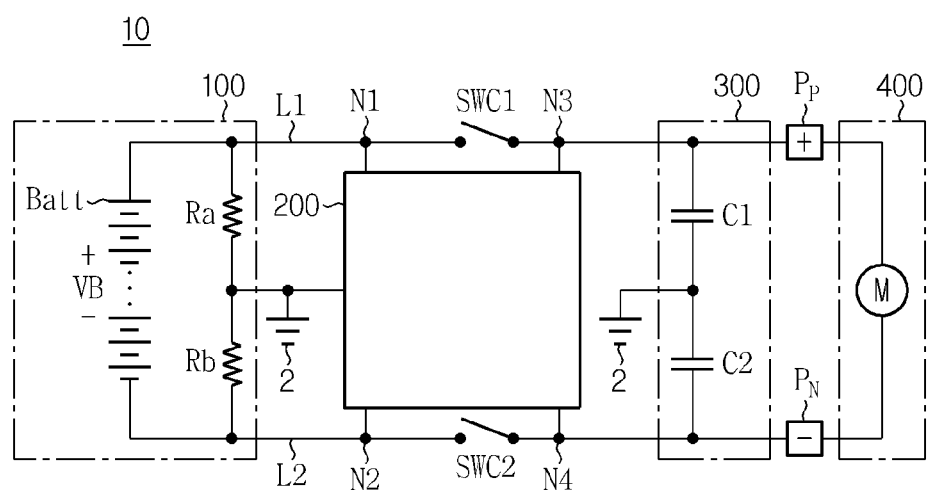

FIGS. 1 and 2 are block diagrams schematically illustrating a functional configuration of a power system 10 and a diagnostic apparatus 200, according to an embodiment of the present disclosure.

First, referring to FIG. 1, the power system 10 may be included in an apparatus capable of storing and supplying electric energy, such as an electric car 1 or the like. Of course, the power system 10 may be included in a large-scale power storage system, such as an energy storage system, or in a small-scale power storage system, such as a smart phone, in addition to the electric car 1.

The power system 10 may basically include a battery module 100, the diagnostic apparatus 200, a noise removing circuit 300, and a load 400.

The battery module 100 includes at least one cell. When a plurality of cells are included in the battery module 100, any one of them may be connected to the other in series or in parallel. A cell included in the battery module 100 may representatively be a lithium ion battery, a lithium polymer battery, a nickel cadmium battery, a nickel hydrogen battery, a nickel zinc battery, or the like. Of course, types of the cell are not limited to those listed above, and are not specifically limited as long as the cell is repeatedly chargeable and dischargeable.

The load 400 converts electric energy provided from the battery module 100 to another form of energy. For example, the load 400 may include an electric motor, and in this case, the load 400 may convert electric energy provided from the battery module 100 to rotation energy. Accordingly, a wheel and/or a cooling fan included in the electric car 1 may be rotated. As another example, the load 400 may include a resistor. In this case, the load 400 may convert the electric energy provided from the battery module 100 to heat energy.

The noise removing circuit 300 is configured to remove noise transmitted from any one of the battery module 100 and the load 400 to the other one by being connected between the battery module 100 and the load 400.

The diagnostic apparatus 200 is configured to diagnose generation of a pre-determined type of accident by being connected between the battery module 100 and the load 400. The diagnostic apparatus 200 is configured to determine at least a current leakage of the battery module 100. In addition, the diagnostic apparatus 200 may determine malfunction of at least one contactor provided on a power supply path between the battery module 100 and the load 400. Furthermore, the diagnostic apparatus 200 may control the power supply path between the battery module 100 and the load 400. Here, the at least one contactor may be provided in a form of being included in the diagnostic apparatus 200.

FIG. 2 is a diagram illustrating, in detail, the power system 10 of FIG. 1. Referring to FIG. 2, the battery module 100 includes a battery assembly Batt including at least one cell. Also, the battery module 100 may be represented in a form additionally including a first insulating resistor Ra and a second insulating resistor Rb. The first insulating resistor Ra and the second insulating resistor Rb may denote virtual resistors indicating insulating states respectively of a positive electrode and a negative electrode of the battery assembly Batt, instead of physical resistors intentionally provided during manufacture of the battery module 100.

When the power system 10 is included in the electric car 1, a ground 2 may be chassis. The first insulating resistor Ra is provided in a form of being connected between the ground 2 and the positive electrode of the battery assembly Batt where a highest potential is formed. The second insulating resistor Rb is provided in a form connected between the ground 2 and the negative electrode of the battery assembly Batt where a lowest potential is formed. The first insulating resistor Ra and the second insulating resistor Rb are for preventing an electric shock accident, and are capable of suppressing a leakage current flowing from the battery assembly Batt due to a current leakage only when a respectively resistance value is sufficiently high.

Electric energy stored in the battery assembly Batt is supplied to the load 400 connected to a first terminal $P_P$ and a second terminal $P_N$. The positive electrode of the battery assembly Batt is electrically connected to the first terminal $P_P$ through a first power line L1. The negative electrode of the battery assembly Batt is electrically connected to the second terminal $P_N$ through a second power line L2.

Contactors SWC1 and SWC2 may be included in at least one of the first power line L1 and the second power line L2. For example, as illustrated, a first contactor SWC1 may be provided on the first power line L1, and a second contactor SWC2 may be provided on the second power line L2. In this case, a power supply path through the first power line L1 may be selectively opened or closed by the first contactor SWC1, and a power supply path through the second power line L2 may be selectively opened or closed by the second contactor SWC2. Power supply from the battery assembly Batt to the load 400 is possible only when the first contactor SWC1 and the second contactor SWC2 are both in a closed state. In other words, power supply from the battery assembly Batt to the load 400 is blocked when at least one of the first contactor SWC1 and the second contactor SWC2 is in an opened state.

In some cases, any one of the first contactor SWC1 and the second contactor SWC2 may be omitted from the power system 10. For example, only the first contactor SWC1 from among the first contactor SWC1 and the second contactor SWC2 may be embodied in a form of being included in the power system 10. In this case, power supply between the battery assembly Batt and the load 400 is blocked while the first contactor SWC1 is in an opened state, and power supply between the battery assembly Batt and the load 400 is performed only when the first contactor SWC1 is in a closed state. A contactor included in at least one of the first power line L1 and the second power line L2 may be included in the diagnostic apparatus 200 described later. Hereinafter, it is assumed that the power system 10 includes both the first contactor SWC1 and the second contactor SWC2.

The noise removing circuit 300 may include a first protection capacitor C1 and a second protection capacitor C2. The first protection capacitor C1 and the second protection capacitor C2 is connected in series between the first terminal $P_P$ and the second terminal $P_N$, and one of two ends of each is commonly connected to the ground 2. The first protection capacitor C1 and the second protection capacitor C2 may be referred to as a 'Y-CAP'. The first protection capacitor C1 and the second protection capacitor C2 are configured to mitigate noise, such as electromagnetic waves, transferred from any one of the battery assembly Batt and the load 400 to the other, by respective capacitance. Hereinafter, it is assumed that the capacitance of the first protection capacitor Ca and the capacitance of the second protection capacitor C2 are the same.

The diagnostic apparatus 200 may be configured to be selectively connectable to at least one of a first node N1, a second node N2, a third node N3, a fourth node N4, and the ground 2.

The first node N1 is located between the positive electrode of the battery assembly Batt and one end of the first contactor SWC1. In other words, the first node N1 is a node to which the positive electrode of the battery module 100 and the one end of the first contactor SWC1 are commonly connected.

The second node N2 is located between the negative electrode of the battery assembly Batt and one end of the second contactor SWC2. In other words, the second node N2 is a node to which the negative electrode of the battery module 100 and the one end of the second contactor SWC2 are commonly connected.

The third node N3 is located between one of two ends of the first protection capacitor C1, which is not connected to the ground 2, and the other end of the first contactor SWC1. In other words, the third node N3 is a node to which the one end of the first protection capacitor C1 and the other end of the first contactor SWC1 are commonly connected.

The fourth node N4 is located between one of two ends of the second protection capacitor C2, which is not connected to the ground 2, and the other end of the second contactor SWC2. In other words, the fourth node N4 is a node to which the one end of the second protection capacitor C2 and the other end of the second contactor SWC2 are commonly connected.

The diagnostic apparatus 200 may select two points that are combinable from the first node N1, the second node N2, the third node N3, the fourth node N4, and the ground 2, and measure a voltage applied between the selected two points. For example, the diagnostic apparatus 200 may measure a voltage between the first node N1 and the fourth node N4. As another example, the diagnostic apparatus 200 may measure a voltage between the first node N1 and the ground 2.

The diagnostic apparatus 200 may sequentially or simultaneously determine a current leakage of the battery module 100 and malfunction of the contactors SWC1 and SWC2 based on a voltage related to at least one of the first node N1, the second node N2, the third node N3, and the fourth node N4. This will be described in detail below with reference to FIGS. 3 through 13.

Figure 3:
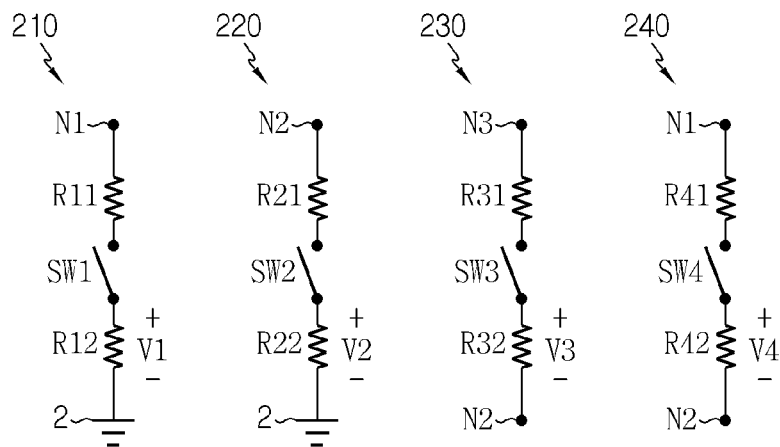
FIG. 3 schematically illustrates a configuration of various circuits that may be included in the diagnostic apparatus of FIG. 2.

FIG. 3 schematically illustrates a configuration of various circuits that may be included in the diagnostic apparatus 200 of FIG. 2.

Referring to FIG. 3, the diagnostic apparatus 200 may include a plurality of voltage dividing units 210, 220, 230, and 240.

A first voltage dividing unit 210 is provided to be connectable between the first node N1 and the ground 2. The first voltage dividing unit 210 is configured to generate a first detection voltage V1 corresponding to a voltage applied between the first node N1 and the ground 2. In detail, the first voltage dividing unit 210 may include a first switch SW1 and a first voltage divider that are configured to be connected to each other in series. The first voltage divider may include a first protection resistor R11 and a first detection resistor R12. The first switch SW1 is configured to selectively apply a voltage applied between the positive electrode and the ground 2 to the first voltage divider, in response to a signal output from a control unit 270 described later. The voltage applied between the first node N1 and the ground 2 is divided by the first voltage divider when the first switch SW1 is in a closed state. The first detection voltage V1 denotes a voltage applied to two ends of the first detection resistor R12. In FIG. 3, the first switch SW1 is connected between the first protection resistor R11 and the first detection resistor R12, but a connection order therebetween is not limited.

A second voltage dividing unit 220 is provided to be connectable between the second node N2 and the ground 2. The second voltage dividing unit 220 is configured to generate a second detection voltage V2 corresponding to a voltage applied between the second node N2 and the ground 2. In detail, the second voltage dividing unit 220 may include a second switch SW2 and a second voltage divider that are configured to be connected to each other in series. The second voltage divider may include a second protection resistor R21 and a second detection resistor R22. The second switch SW2 is configured to selectively apply a voltage applied between the negative electrode and the ground 2 to the second voltage divider, in response to a signal output from the control unit 270 described later. The voltage applied between the second node N2 and the ground 2 is divided by the second voltage divider when the second switch SW2 is in a closed state. The second detection voltage V2 denotes a voltage applied to two ends of the second detection resistor R22. In FIG. 3, the second switch SW2 is connected between the second protection resistor R21 and the second detection resistor R22, but a connection order therebetween is not limited.

A ratio between a resistance value of the first protection resistor R11 and a resistance value of the first detection resistor R12 may be designed to be equal to a ratio between the resistance value of the second protection resistor R21 and a resistance value of the second detection resistor R22. For example, the resistance value of the first protection resistor R11 and the resistance value of the second protection resistor R21 may be the same, and the resistance value of the first detection resistor R12 and the resistance value of the second detection resistor R22 may be the same. Here, in order to protect the first detection resistor R12 and the second detection resistor R22 from a high voltage, the resistance value of each of the first protection resistor R11 and the second protection resistor R21 may be designed to be sufficiently larger than the resistance value of each of the first detection resistor R12 and the second detection resistor R22. For example, the resistance value of the first protection resistor R11 may be 99 times larger than the resistance value of the first detection resistor R12, and at this time, the first detection voltage V1 corresponds to $1/100$ of the voltage applied between the first node N1 and the ground 2.

The first voltage dividing unit 210 and the second voltage dividing unit 220 may be used to determine a current leakage of the battery module 100.

The control unit 270 may calculate a voltage VB between the positive electrode and the negative electrode of the battery assembly Batt based on the first detection voltage V1 and the second detection voltage V2.

A third voltage dividing unit 230 is provided to be connectable between the third node N3 and the second node N2. The third voltage dividing unit 230 is configured to generate a third detection voltage V3 corresponding to a voltage applied between the third node N3 and the second node N2. In detail, the third voltage dividing unit 230 may include a third switch SW3 and a third voltage divider. The third voltage divider may include a third protection resistor R31 and a third detection resistor R32. The third switch SW3 is configured to selectively apply a voltage applied between the third node N3 and the second node N2 to the third voltage divider, in response to a signal output from the control unit 270 described later. The voltage applied between the third node N3 and the second node N2 is divided by the third voltage divider when the third switch SW3 is in a closed state. The third detection voltage V3 denotes a voltage applied to two ends of the third detection resistor R32. In FIG. 3, the third switch SW3 is connected between the third protection resistor R31 and the third detection resistor R32, but a connection order therebetween is not limited.

A fourth voltage dividing unit 240 is provided to be connectable between the first node N1 and the second node N2. The fourth voltage dividing unit 240 is configured to generate a fourth detection voltage V4 corresponding to a voltage applied between the first node N1 and the second node N2, i.e., the voltage VB of the battery assembly Batt.

In detail, the fourth voltage dividing unit 240 may include a first switch SW4 and a fourth voltage divider. The fourth voltage divider may include a fourth protection resistor R41 and a fourth detection resistor R42. The fourth switch SW4 is configured to selectively apply the voltage applied between the first node N1 and the second node N2 to the fourth voltage divider, in response to a signal output from the control unit 270 described later. The voltage applied between the first node N1 and the second node N2 is divided by the fourth voltage divider when the fourth switch SW4 is in a closed state. The fourth detection voltage V4 denotes a voltage applied to two ends of the fourth detection resistor R42. In FIG. 3, the fourth switch SW4 is connected between the fourth protection resistor R41 and the fourth detection resistor R42, but a connection order therebetween is not limited.

The control unit 270 may calculate the voltage VB of the battery assembly Batt based on the fourth detection voltage V4.

A ratio between a resistance value of the fourth protection resistor R41 and a resistance value of the fourth detection resistor R42 may be designed to be equal to a ratio between a resistance value of the third protection resistor R31 and a resistance value of the third detection resistor R32. For example, the resistance value of the fourth protection resistor R41 and the resistance value of the third protection resistor R31 may be the same, and the resistance value of the fourth detection resistor R42 and the resistance value of the third detection resistor R32 may be the same. Here, in order to protect the fourth detection resistor R42 and the third detection resistor R32 from a high voltage, the resistance value of each of the fourth protection resistor R41 and the third protection resistor R31 may be designed to be sufficiently larger than the resistance value of each of the fourth detection resistor R42 and the third detection resistor R32.

The third voltage dividing unit 230 may be used to diagnose malfunction of the first contactor SWC1 and/or the second contactor SWC2. The fourth voltage dividing unit 240 may be used to diagnose a current leakage of the battery module 100 and malfunction of the first contactor SWC1 and/or the second contactor SWC2.

Figure 4:
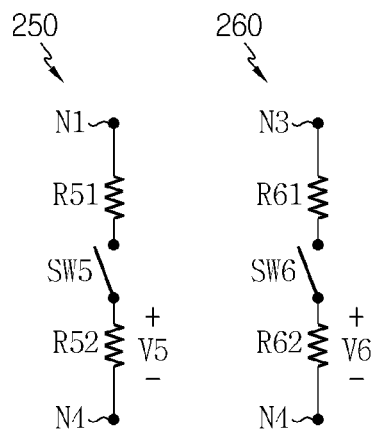
FIG. 4 schematically illustrates a configuration of various circuits that may be additionally included in the diagnostic apparatus of FIG. 2.

FIG. 4 schematically illustrates a configuration of various circuits that may be additionally included in the diagnostic apparatus 200 of FIG. 2.

Referring to FIG. 4, the diagnostic apparatus 200 may further include at least one of a fifth voltage dividing unit 250 and a sixth voltage dividing unit 260.

The fifth voltage dividing unit 250 may be provided to be connectable between the first node N1 and the fourth node N4. The fifth voltage dividing unit 250 is configured to generate a fifth detection voltage V5 corresponding to a voltage applied between the first node N1 and the fourth node N4. In detail, the fifth voltage dividing unit 250 may include a fifth switch SW5 and a fifth voltage divider. The fifth voltage divider may include a fifth protection resistor R51 and a fifth detection resistor R52. The fifth switch SW5 is configured to selectively apply a voltage applied between the first node N1 and the fourth node N4 to the fifth voltage divider, in response to a signal output from the control unit 270 described later. The voltage applied between the first node N1 and the fourth node N4 is divided by the fifth voltage divider when the fifth switch SW5 is in a closed state. The fifth detection voltage V5 denotes a voltage applied to two ends of the fifth detection resistor R52. In FIG. 3, the fifth switch SW5 is connected between the fifth protection resistor R51 and the fifth detection resistor R52, but a connection order therebetween is not limited.

The sixth voltage dividing unit 260 may be provided to be connectable between the third node N3 and the fourth node N4. The sixth voltage dividing unit 260 is configured to generate a sixth detection voltage V6 corresponding to a voltage applied between the third node N3 and the fourth node N4. In detail, the sixth voltage dividing unit 260 may include a sixth switch SW6 and a sixth voltage divider. The sixth voltage divider may include a sixth protection resistor R61 and a sixth detection resistor R62. The sixth switch SW6 is configured to selectively apply the voltage applied between the third node N3 and the fourth node N4 to the sixth voltage divider, in response to a signal output from the control unit 270 described later. The voltage applied between the third node N3 and the fourth node N4 is divided by the sixth voltage divider when the sixth switch SW6 is in a closed state. The sixth detection voltage V6 denotes a voltage applied to two ends of the sixth detection resistor R62. In FIG. 3, the sixth switch SW6 is connected between the sixth protection resistor R61 and the sixth detection resistor R62, but a connection order therebetween is not limited.

A ratio between a resistance value of the fifth protection resistor R51 and a resistance value of the fifth detection resistor R52 may be designed to be equal to a ratio between a resistance value of the sixth protection resistor R61 and a resistance value of the sixth detection resistor R62. For example, the resistance value of the fifth protection resistor R51 and the resistance value of the sixth protection resistor R61 may be the same, and the resistance value of the fifth detection resistor R52 and the resistance value of the sixth detection resistor R62 may be the same. Here, in order to protect the fifth detection resistor R52 and the sixth detection resistor R62 from a high voltage, the resistance value of each of the fifth protection resistor R51 and the sixth protection resistor R61 may be designed to be sufficiently larger than the resistance value of each of the fifth detection resistor R52 and the sixth detection resistor R62.

The fifth voltage dividing unit 250 may be used to determine malfunction of the second contactor SWC2. The sixth voltage dividing unit 260 may be used to determine malfunction of the first contactor SWC1 and the second contactor SWC2.

In relation to FIGS. 3 and 4, the diagnostic apparatus 200 may basically include the first voltage dividing unit 210, the second voltage dividing unit 220, the third voltage dividing unit 230, and the control unit 270, and may further include at least one of the fourth voltage dividing unit 240, the fifth voltage dividing unit 250, and the sixth voltage dividing unit 260 according to an embodiment.

Hereinafter, it is assumed that resistance values of the first through sixth switches SW1 through SW6, the contactors SWC1 and SWC2, and the power lines L1 and L2 are so small as to be negligible.

Figure 5:
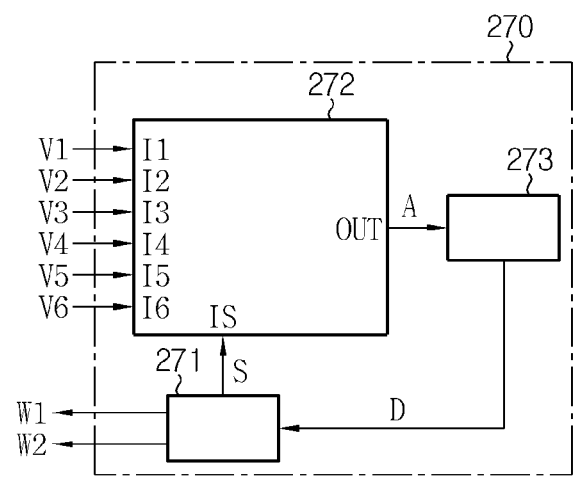
FIG. 5 is a block diagram schematically illustrating a functional configuration of a control unit controlling an operation of a diagnostic apparatus.

FIG. 5 is a block diagram schematically illustrating a functional configuration of the control unit 270 controlling an operation of the diagnostic apparatus 200.

Referring to FIG. 5, the control unit 270 of the diagnostic apparatus 200 may include a microprocessor 271, a multiplexer 272, and an ADC 273. The ADC 273 denotes an analog-digital converter.

The microprocessor 271 may manage overall operations of the diagnostic apparatus 200. The microprocessor 271 is communicably connected to other components included in the diagnostic apparatus 200 so as to transmit or receive a signal related to the power system 10.

The microprocessor 271 may output signals of designating operation states of the plurality of switches SW1 through SW6 and at least one of the contactors SWC1 and SWC2. In other words, the microprocessor 271 may individually control the plurality of switches SW1 through SW6 and at least one of the contactors SWC1 and SWC2 so as to induce each of them to be in an opened state or a closed state. The microprocessor 271 may output a signal S commanding selecting of at least one of the first through sixth detection voltages V1 through V6 according to a pre-determined rule.

At least one memory may be embedded in the microprocessor 271. The memory may pre-store a program and data related to various operations performed by the diagnostic apparatus 200. For example, the memory may store resistance values of resistors included in each of the first through sixth voltage dividing units 210 through 260. As another example, the memory may have recorded thereon data and software for measuring detection voltages and determining generation of several types of accidents based on measured results.

The multiplexer 272 includes a plurality of voltage input ports I1 through I6, a selection input port IS, and an output port OUT. The detection voltages V1 through V6 generated by voltage generation units may be respectively applied to the voltage input ports I1 through I6.

The signal S output from the microprocessor 271 is input to the selection input port IS. The multiplexer 272 selects any one of the plurality of voltage input ports I1 through I6 based on the signal input to the selection input port IS, and connects the selected voltage input port to the output port OUT. In other words, the multiplexer 272 is configured to selectively output one of the detection voltages V1 through V6.

The ADC 273 converts an analog signal A provided from the multiplexer 272 to a digital signal D, and transfers the digital signal D to the microprocessor 271. It is obvious to one of ordinary skill in the art that the analog signal A may be any one of the detection voltages V1 through V6. The microprocessor 271 may individually measure the detection voltages V1 through V6 based on the digital signal D received from the ADC 273. For example, the microprocessor 271 may measure the detection voltage V1 based on the digital signal D transmitted from the ADC 273, while the voltage input port I1 and the output port OUT are connected by the multiplexer 272 according to a command of the microprocessor 271.

The microprocessor 271 may determine each of a current leakage of the battery module 100 and/or malfunction of at least one contactor based on measurement results with respect to the detection voltages V1 through V6, and output alarm signals W1 and W2 each notifying a determination result.

Figure 6:
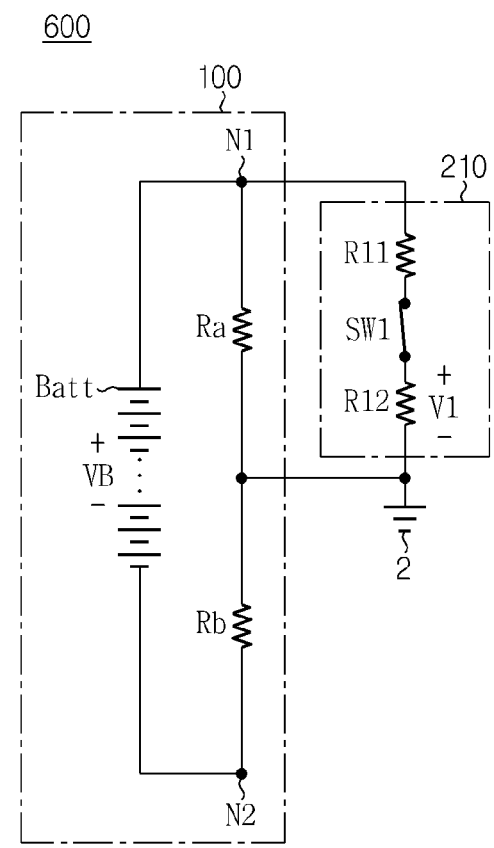
FIGS. 6 and 7 are reference diagrams for explaining an operation of a diagnostic apparatus determining a current leakage of a battery module, according to an embodiment of the present disclosure.
Figure 7:
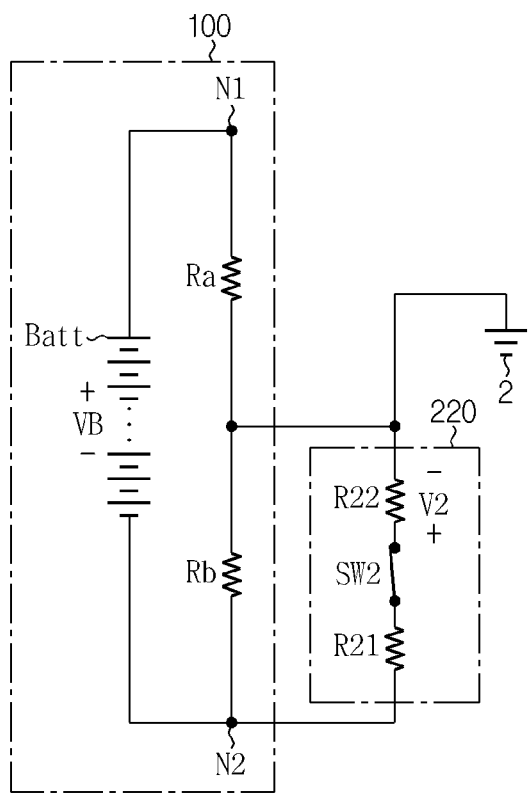

FIGS. 6 and 7 are diagrams referred to so as to describe an operation of the diagnostic apparatus 200 determining a current leakage of the battery module 100, according to an embodiment of the present disclosure. For convenience of description, it is assumed that the voltage VB of the battery assembly Batt is pre-measured.

FIG. 6 illustrates a first circuit 600 formed in the power system 10. Referring to FIGS. 2 and 3 together, the control unit 270 may form the first circuit 600 by controlling the first switch SW1 to be in a closed state and at least the second switch SW2 from among the remaining switches SW2 through SW6 and the contactors SWC1 and SWC2 to be in an opened state. The control unit 270 may measure the first detection voltage V1 provided from the first voltage dividing unit 210 while the first circuit 600 is formed.

When the positive electrode of the battery assembly Batt is leaking, a resistance value of the first insulating resistor Ra becomes very small compared to when it does not leak. Accordingly, since most of the voltage VB of the battery assembly Batt is applied to the second insulating resistor Rb, a magnitude of the first detection voltage V1 measured during current leakage may be smaller than a value measured during non-current leakage.

FIG. 7 illustrates a second circuit 700 formed in the power system 10. Referring to FIGS. 2 and 3 together, the control unit 270 may form the second circuit 700 by controlling the second switch SW2 to be in a closed state and at least the first switch SW1 from among the remaining switches SW1 and SW3 through SW6 and the contactors SWC1 and SWC2 to be in an opened state. The control unit 270 may measure the second detection voltage V2 provided from the second voltage dividing unit 220 while the second circuit 700 is formed.

When the negative electrode of the battery assembly Batt is leaking, a resistance value of the second insulating resistor Rb becomes very small compared to when it does not leak. Accordingly, since most of the voltage VB of the battery assembly Batt is applied to the first insulating resistor Ra during current leakage of the negative electrode of the battery assembly Batt, a magnitude of the second detection voltage V2 measured during the current leakage may be smaller than a value measured during non-current leakage.

Figure 8:
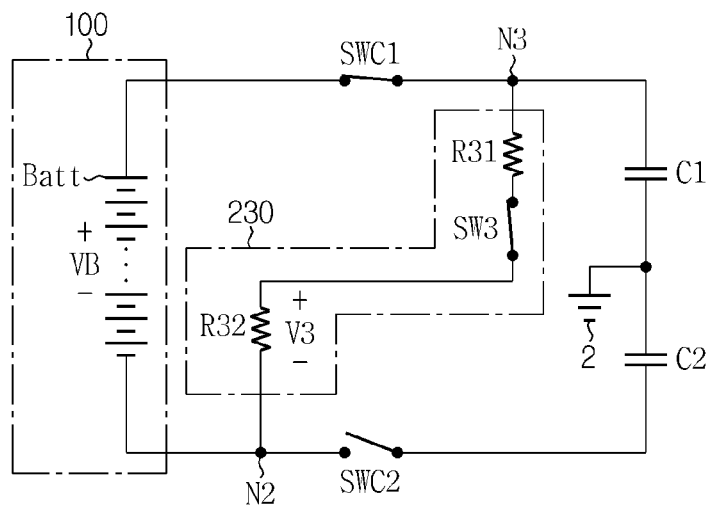
FIGS. 8 and 9 are reference diagrams for explaining an operation of a diagnostic apparatus determining malfunction of at least one contact, according to an embodiment of the present disclosure.
Figure 9:
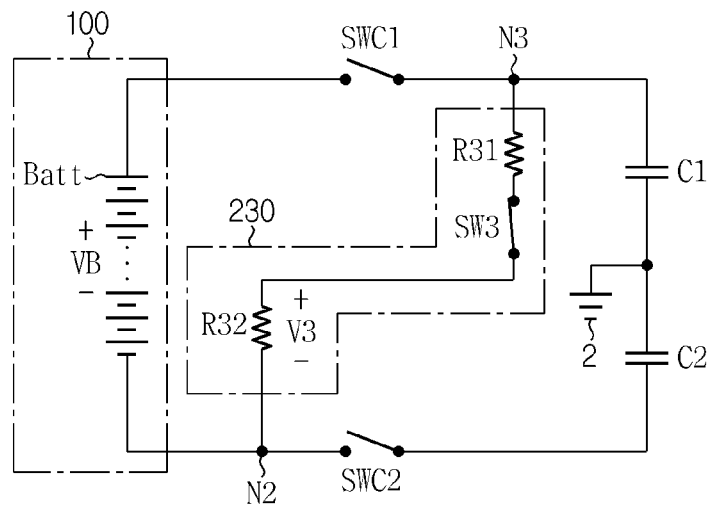

FIGS. 8 and 9 are diagrams referred to so as to describe an operation of a diagnostic apparatus determining malfunction of at least one contact, according to an embodiment of the present disclosure. For convenience of description, illustration of the first insulating resistor Ra and the second insulating resistor Rb are omitted, and it is assumed that the voltage VB of the battery assembly Batt is pre-measured.

FIG. 8 illustrates a third circuit 800 formed in the power system 10 for determining a disconnection (open circuit fault) caused by malfunction of the first contactor SWC1. Referring to FIGS. 2 and 3 together, the control unit 270 may form the third circuit 800 by controlling the third switch SW3 and the first contactor SWC1 to be in a closed state, and controlling at least the first switch SW1, the second switch SW2, and the second contactor SWC2 from among the remaining switches and the second contactor SWC2 to be in an opened state. In the third circuit 800, since the first switch SW1, the second switch SW2, and the second contactor SWC2 are in an opened state, the first protection capacitor C1 and the second protection capacitor C2 may not affect the voltage applied between the third node N3 and the second node N2. The control unit 270 may measure the third detection voltage V3 provided from the third voltage dividing unit 230 while the third circuit 800 is formed.

The control unit 270 may determine a disconnection of the first contactor SWC1 by comparing the voltage VB of the battery assembly Batt, which is pre-measured, and the third detection voltage V3 measured from the third circuit 800. For example, it may be determined that disconnection malfunction of the first contactor SWC1 is generated when the third detection voltage V3 is lower than the voltage VB of the battery assembly Batt by at least a pre-determined first set value.

FIG. 9 illustrates a fourth circuit 900 formed in the power system 10 for determining a short circuit (short circuit fault) caused by malfunction of the first contactor SWC1. A short-circuited state caused by malfunction may be referred to as a 'stuck closed status'.

Referring to FIGS. 2 and 3 together, the control unit 270 may form the fourth circuit 900 by controlling the third switch SW3 to be in a closed state, and controlling at least the first switch SW1 and the second switch SW2 from among the remaining switches, and the first contactor SWC1 and the second contactor SWC2 to be in an opened state. In the fourth circuit 900, since the first switch SW1, the second switch SW2, and the second contactor SWC2 are in an opened state, the first protection capacitor C1 and the second protection capacitor C2 may not affect the voltage applied between the third node N3 and the second node N2. The control unit 270 may measure the third detection voltage V3 provided from the third voltage dividing unit 230 while the fourth circuit 900 is formed.

The control unit 270 may determine a short circuit of the first contactor SWC1 by comparing the voltage VB of the battery assembly Batt, which is pre-measured, and the third detection voltage V3 measured from the fourth circuit 900. For example, it may be determined that the first contactor SWC1 is short-circuited when the third detection voltage V3 is lower than the voltage VB of the battery assembly Batt by a pre-determined second set value.

In FIGS. 8 and 9, the circuits 800 and 900 for determining malfunction of the first contactor SWC1 have been mainly described, but malfunction of the second contactor SWC2 may be determined in the similar manner by using the fifth voltage dividing unit 250 instead of the third voltage dividing unit 230. In detail, the control unit 270 may determine that a disconnection malfunction of the second contactor SWC2 is generated when the fifth detection voltage V5 measured, in order to determine disconnection of the second contactor SWC2, while the fifth switch SW5 and the second contactor SWC2 are in a closed state and at least the first switch SW1, the second switch SW2, and the first contactor SWC1 from among the remaining switches and the second contactor SWC2 are in an opened state is lower than the voltage VB of the battery assembly Batt by at least a third pre-determined third set value.

Alternatively, it may be determined that a short circuit of the second contactor SWC2 is generated when the fifth detection voltage V5 measured, in order to determine the short circuit of the second contactor SWC2, while the fifth switch SW5 is in a closed state and at least the first switch SW1 and the second switch SW2 from among the remaining switches, and the first contactor SWC1 and the second switch SW2 are in an opened state is lower than the voltage VB of the battery assembly Batt by a fourth pre-determined third set value.

Figure 10:
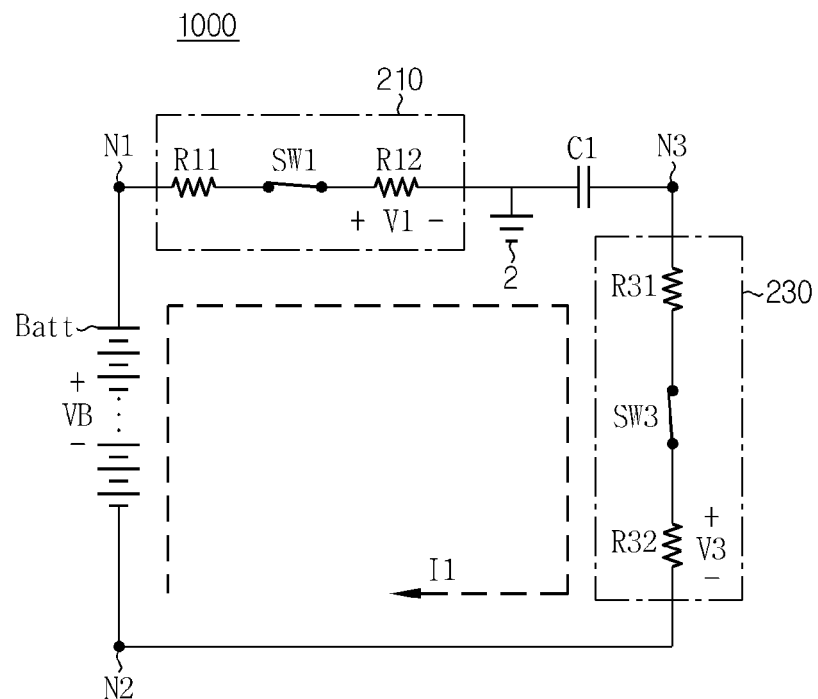
FIGS. 10 and 11 illustrate circuits formable by a diagnostic apparatus, according to an embodiment of the present disclosure.
Figure 11:
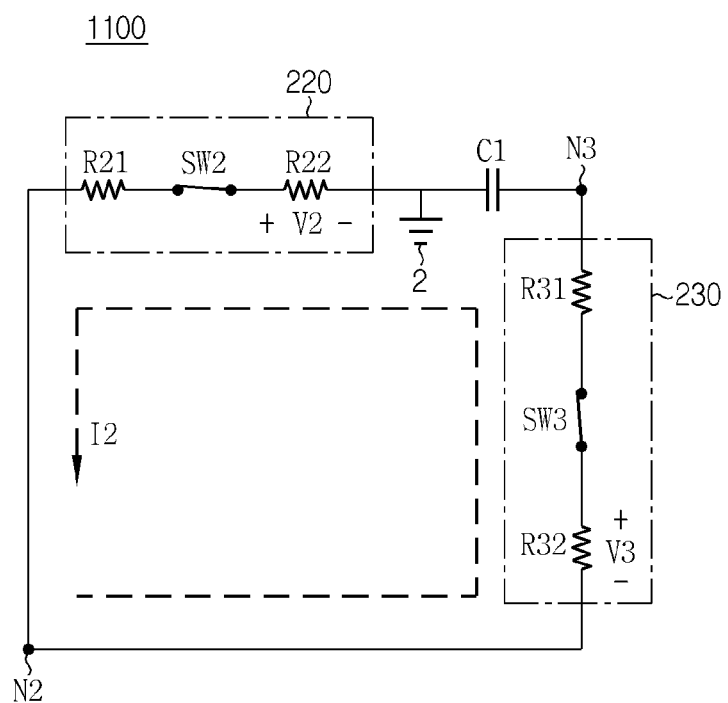
Figure 12:
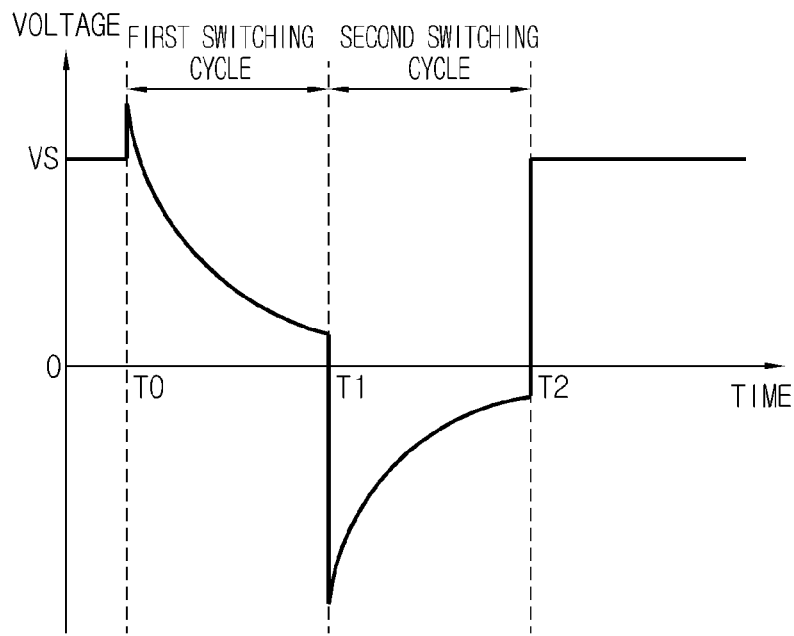
FIGS. 12 and 13 are graphs related to the circuits illustrated in FIGS. 10 and 11.
Figure 13:
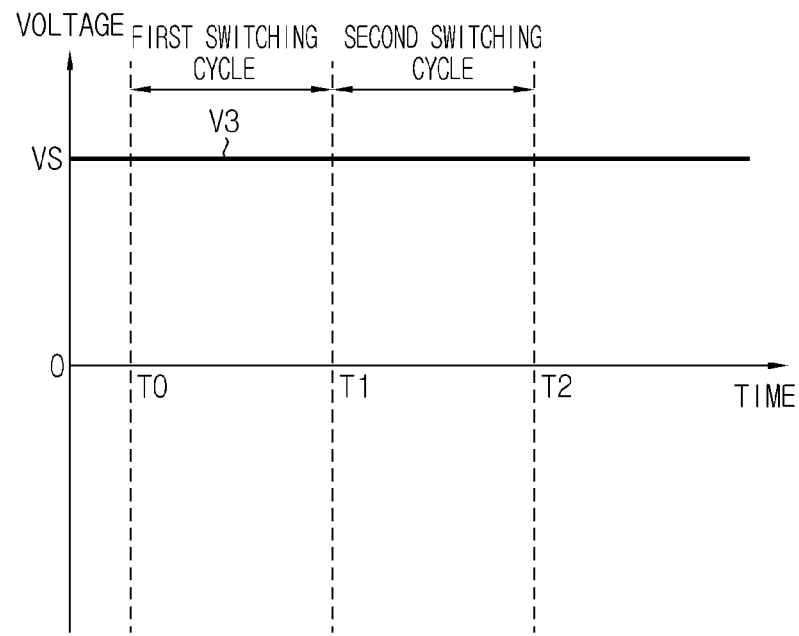

FIGS. 10 and 11 illustrate circuits formable by the diagnostic apparatus 200, according to an embodiment of the present disclosure, and FIGS. 12 and 13 are graphs related to the circuits illustrated in FIGS. 10 and 11. For convenience of description, illustration of the first insulating resistor Ra and the second insulating resistor Rb are omitted, and it is assumed that the voltage VB of the battery assembly Batt is pre-measured.

Referring to FIG. 10 together with FIGS. 2 and 3, a fifth circuit 1000 formed in the power system 10 is identified. The fifth circuit 1000 is a circuit formed while the first switch SW1 and the third switch SW3 are in a closed state, and the second switch SW2, the first contactor SWC1, and the second contactor SWC2 are in an opened state. The fifth circuit 1000 is a closed circuit including a positive electrode, the first node N1, the first voltage dividing unit 210, the ground 2, the first protection capacitor C1, the third node N3, and the third voltage dividing unit 230. Hereinafter, a section where the fifth circuit 1000 is continuously maintained is referred to as a 'first switching cycle'.

As illustrated, when the fifth circuit 1000 is formed, the first protection capacitor C1 is charged as the current I1 flows in a direction from the positive electrode to the negative electrode of the battery assembly Batt, by the voltage VB of the battery assembly Batt. As the first protection capacitor C1 is gradually charged, the third detection voltage V3 is gradually reduced by having a positive value. For example, when the fifth circuit 1000 is maintained for a long period of time, a voltage of the first protection capacitor C1 will become the same as the voltage VB of the battery assembly Batt, and as a result, the third detection voltage V3 will become 0 V.

Referring to FIG. 11 together with FIGS. 2 and 3, a sixth circuit 1100 formed in the power system 10 is identified. The sixth circuit 1100 is a circuit formed while the second switch SW2 and the third switch SW3 are in a closed state, and the first switch SW1, the first contactor SWC1, and the second contactor SWC2 are in an opened state. The sixth circuit 1100 is a closed circuit including the second node N2, the second voltage dividing unit 220, the ground 2, the first protection capacitor C1, the third node N3, and the third voltage dividing unit 230. Hereinafter, a section where the sixth circuit 1100 is continuously maintained is referred to as a 'second switching cycle'.

As illustrated, when the sixth circuit 1100 is formed, the first protection capacitor C1 is discharged and a voltage of an inverse direction is applied to the third detection resistor R32 according to flow of the current I2. In other words, the third detection voltage V3 detected by the control unit 270 has a negative value. In this case, as the first protection capacitor C1 is gradually discharged, the third detection voltage V3 is increased towards 0 V.

Lengths of the first switching cycle and the second switching cycle described above may be set to be the same. Together or individually, the control unit 270 may alternately execute the first switching cycle and the second switching cycle while controlling the first contactor SWC1 and the second contactor SWC2 to be both in an opened state. For example, the first switching cycle and the second switching cycle may be executed in an order of first switching cycle→second switching cycle→first switching cycle-→second switching cycle.

As will be described below, the fifth circuit 1000 may be formed while the first circuit 600 is formed. In other words, a period where the first circuit 600 is formed and a period where the fifth circuit 1000 is formed may at least partially overlap. Also, the sixth circuit 1100 may be formed while the second circuit 700 is formed. In other words, a period where the second circuit 700 is formed and a period where the sixth circuit 1100 is formed may at least partially overlap. In this regard, it is possible to determine a short circuit of the first contactor SWC1 and the second contactor SWC2 by using the fifth circuit 1000 and the sixth circuit 1100 while determining a current leakage of the battery module 100 by using the first circuit 600 and the second circuit 700.

Hereinafter, a section where the control unit 270 controls the first contactor SWC1 and the second contactor SWC2 to be both in an opened state is referred to as an 'inactive section' and a section where the control unit 270 controls the first contactor SWC1 and the second contactor SWC2 to be both in a closed state is referred to as an 'active section', and it is assumed that the voltage VB of the battery assembly Batt is maintained constant. In this regard, the first switching cycle and the second switching cycle described above both belong to the inactive section. Also, it is obvious to one of ordinary skill in the art that power supply between the battery module 100 and the load 400 is possible during the active section, and power supply between the battery module 100 and the load 400 is blocked during the inactive section.

In FIGS. 12 and 13, before T0 and after T2 belong to an active section, and from T0 to T2 belong to an inactive section. In the inactive section of FIGS. 12 and 13, it is assumed that the first switching cycle and the second switching cycle are each executed once for periods of time, which do not overlap each other. Of course, at least one of the first switching cycle and the second switching cycle may be executed at least twice during the inactive section.

First, FIG. 12 illustrates a pattern indicating a change of the third detection voltage V3 according to time, when the first contactor SWC1 and the second contactor SWC2 are in a normal state without a short circuit caused by malfunction. In detail, before T0 and after T2, since the voltage VB of the battery assembly Batt is applied between the third node N3 and the second node N2 through the first contactor SWC1 and the second contactor SWC2, the third detection voltage V3 may be maintained to a uniform positive value VS.

The control unit 270 may record a first pattern including values obtained by measuring the third detection voltage V3 a plurality of times according to time, during the first switching cycle from T0 to T1 where the fifth circuit 1000 of FIG. 10 is formed.

The control unit 270 may record a second pattern including values obtained by measuring the third detection voltage V3 a plurality of times according to time, during the second switching cycle from T1 to T2 where the sixth circuit 1100 of FIG. 11 is formed. Here, the second pattern may be recorded separately from the first pattern.

As shown in FIG. 12, the first pattern may be a pattern that is gradually decreased while having a positive value (i.e., higher than 0 V), and the second pattern may be a pattern that is gradually increased while having a negative value (i.e., lower than 0 V).

The control unit 270 may determine that the first contactor SWC1 is in a normal state when the first pattern recorded during the first switching cycle has a form shown in FIG. 12.

The control unit 270 may determine that the second contactor SWC2 is in a normal state when the pattern recorded during the second switching cycle has a form shown in FIG. 12.

When the first pattern recorded during the first switching cycle and the second pattern recorded during the second switching cycle both have the forms shown in FIG. 12, the control unit 270 may determine both the first contactor SWC1 and the second contactor SWC2 are in a normal state.

Meanwhile, when only the first contactor SWC1 from among the first contactor SWC1 and the second contactor SWC2 is short-circuited due to malfunction, the first node N1 and the third node N3 are electrically connected through the first contactor SWC1 despite the inactive section designated by the control unit 270. In this case, since the voltage VB of the battery assembly Batt is applied to the third voltage dividing unit 230, the third detection voltage V3 may not follow the first pattern as shown in FIG. 12.

Also, when only the second contactor SWC2 from among the first contactor SWC1 and the second contactor SWC2 is short-circuited due to malfunction, the second node N2 and the fourth node N4 are electrically connected through the second contactor SWC2 despite the inactive section designated by the control unit 270. In this case, the second voltage dividing unit 220 and the second protection capacitor C2 are connected in parallel, and the third detection voltage V3 does not follow the second pattern as shown in FIG. 12. For example, the third detection voltage V3 may be equal to or higher than 0 V.

Next, FIG. 13 illustrates a pattern indicating a change of the third detection voltage V3 according to time, when the first contactor SWC1 and the second contactor SWC2 are both short-circuited due to malfunction. As shown in FIG. 12, since the voltage VB of the battery assembly Batt is applied between the third node N3 and the second node N2 through the first contactor SWC1 and the second contactor SWC2 before T0 and after T2, the third detection voltage V3 may be maintained constant to the positive value VS.

However, when the first contactor SWC1 and the second contactor SWC2 are both short-circuited, the first contactor SWC1 and the second contactor SWC2 both maintain a closed state despite the inactive section designated by the control unit 270. Accordingly, as shown in FIG. 13, the third detection voltage V3 may maintain the uniform value VS from T0 to T2 where the first switching cycle and the second switching cycle are alternately executed, which is a clear contrast to a continuous changing pattern of the third detection voltage V3 shown in FIG. 12.

Referring to FIGS. 10 and 12, if the first contactor SWC1 and the second contactor SWC2 are not short-circuited, it is determined that the third detection voltage V3 changes according to time while the first switching cycle or the second switching cycle is executed. Accordingly, it is difficult to specify the value of third detection voltage V3 compared with the voltage VB of the battery assembly Batt, which his pre-measured, during the first switching cycle or the second switching cycle. Accordingly, during the first switching cycle or the second switching cycle, it is possible to record a pattern including values obtained by measuring the third detection voltage V3 changing according to time a plurality of times, and simultaneously or sequentially determine short circuits of the first contactor SWC1 and the second contactor SWC2 based on the recorded pattern.

As a result, the first diagnostic function of determining a current leakage of the battery module 100, and the second diagnostic function of determining a short circuit of at least one of the contactors SWC1 and SWC2 may not have to be executed at different periods of time, which do not overlap each other. In other words, the second diagnostic function may be executed while the first diagnostic function is executed, and the first diagnostic function may be executed while the second diagnostic function is executed.

Of course, as occasion demands, periods of time when the first diagnostic function and the second diagnostic function are performed may be controlled by the control unit 270 to not to overlap each other.

Referring back to FIG. 5, the control unit 270 may output a first alarm signal W1 notifying an execution result of the first diagnostic function and/or a second alarm signal SW notifying an execution result of the second diagnostic function.

The first alarm signal W1 and the second alarm signal W2 output from the control unit 270 may be converted to a form recognizable by a user through an information guide device (not shown) included in the power system 10 and/or the electric car 1. For example, the information guide device may convert and output the alarm signals W1 and S2 to a visual and/or acoustic signal.

Embodiments of the present disclosure described above are not embodied only through an apparatus and a method, but may be embodied through a program realizing a function corresponding to a feature of the embodiments of the present disclosure or a recording medium having recorded thereon the program, and such embodiments may be easily embodied by one of ordinary skill in the art from the description of the embodiments described above.

The present disclosure has been described by limited embodiments and drawings, but the present disclosure is not limited thereto, and various changes and modifications are possible within the scope of the disclosure and the equivalent range of appended claims by one of ordinary skill in the art.

Also, since the present disclosure described above may be variously substituted, modified, and changed by one of ordinary skill in the art within the range of the technical ideas of the present disclosure, the present disclosure is not limited by the above-described embodiments and appended drawings, but all or some of the embodiments may be selectively combined for various modifications.

What is claimed is:

1. A diagnostic apparatus for a power system that comprises a battery assembly, a first contactor, a second contactor, a first protection capacitor, and a second protection capacitor, the diagnostic apparatus comprising:
    a first voltage dividing unit connected between a ground of the power system and a first node to which a positive electrode of the battery assembly and one end of the first contactor are commonly connected, and configured to generate a first detection voltage by dividing a voltage applied between the first node and the ground;
    a second voltage dividing unit connected between the ground and a second node to which a negative electrode of the battery assembly and one end of the second contactor are commonly connected, and configured to generate a second detection voltage by dividing a voltage applied between the second node and the ground;
    a third voltage dividing unit connected between the second node and a third node to which one end of the first protection capacitor and another end of the first contactor are commonly connected, and configured to generate a third detection voltage by dividing a voltage between the third node and the second node; and
    a control unit configured to control the first contactor, the second contactor, and the first through third voltage dividing units,
    wherein the first voltage dividing unit comprises:
    a first voltage divider configured to divide a voltage applied between the first node and the ground, and comprising a first protection resistor and a first detection resistor; and
    a first switch configured to selectively apply the voltage applied between the first node and the ground to the first voltage divider, in response to a signal output from the control unit,
    wherein the second voltage dividing unit comprises:
    a second voltage divider configured to divide a voltage applied between the second node and the ground, and comprising a second protection resistor and a second detection resistor; and
    a second switch configured to selectively apply the voltage applied between the second node and the ground to the second voltage divider, in response to a signal output from the control unit,
    wherein the third dividing unit comprises:
    a third voltage divider configured to divide a voltage applied between the third node and the second node, and comprising a third protection resistor and a third detection resistor; and
    a third switch configured to selectively apply the voltage applied between the third node and the second node to the third voltage divider, in response to a signal output from the control unit,
    wherein the control unit is configured to execute a first diagnostic function and a second diagnostic function during an inactive section where the first contactor and the second contactor are controlled in an opened state,
    wherein the first diagnostic function is a function of determining a current leakage of the battery assembly based on the first detection voltage and the second detection voltage,
    the second diagnostic function is a function of determining a short circuit of at least one of the first contactor and the second contactor based on the third detection voltage,
    wherein the inactive section comprises a first switching cycle in which the first switch and the third switch are controlled in a closed state, and the second switch is controlled in an opened state, and
    the control unit is configured to record a first pattern comprising values of the third detection voltage measured a plurality of times according to time during the first switching cycle, and determine a short circuit of the first contactor based on the first pattern.

2. The diagnostic apparatus of claim 1,
    wherein the first detection resistor generates the first detection voltage when the first switch is in a closed state, and
    the second detection resistor generates the second detection voltage when the second switch is in a closed state.

3. The diagnostic apparatus of claim 2,
    wherein the third detection resistor generates the third detection voltage when the third switch is in a closed state.

4. The diagnostic apparatus of claim 1, wherein the control unit comprises:
    a microprocessor;
    a multiplexer configured to select at least one of the first to third detection voltages, in response to a signal provided from the microprocessor; and
    an analog-digital converter (ADC) configured to convert a detection voltage selected by the multiplexer to a digital signal and transmit the digital signal to the microprocessor.

5. The diagnostic apparatus of claim 1, wherein another end of each of the first protection capacitor and the second protection capacitor is commonly connected to the ground.

6. The diagnostic apparatus of claim 1, wherein the control unit is configured to output a first alarm signal notifying an execution result of the first diagnostic function and a second alarm signal notifying an execution result of the second diagnostic function.

7. A power system comprising the diagnostic apparatus according to claim 1.

8. An electric car comprising the power system according to claim 7.

9. A diagnostic apparatus for a power system that comprises a battery assembly, a first contactor, a second contactor, a first protection capacitor, and a second protection capacitor, the diagnostic apparatus comprising:
- a first voltage dividing unit connected between a ground of the power system and a first node to which a positive electrode of the battery assembly and one end of the first contactor are commonly connected, and configured to generate a first detection voltage by dividing a voltage applied between the first node and the ground;
- a second voltage dividing unit connected between the ground and a second node to which a negative electrode of the battery assembly and one end of the second contactor are commonly connected, and configured to generate a second detection voltage by dividing a voltage applied between the second node and the ground;
- a third voltage dividing unit connected between the second node and a third node to which one end of the first protection capacitor and another end of the first contactor are commonly connected, and configured to generate a third detection voltage by dividing a voltage between the third node and the second node; and
- a control unit configured to control the first contactor, the second contactor, and the first through third voltage dividing units,
- wherein the first voltage dividing unit comprises:
- a first voltage divider configured to divide a voltage applied between the first node and the ground, and comprising a first protection resistor and a first detection resistor; and
- a first switch configured to selectively apply the voltage applied between the first node and the ground to the first voltage divider, in response to a signal output from the control unit, and
- wherein the second voltage dividing unit comprises:
- a second voltage divider configured to divide a voltage applied between the second node and the ground, and comprising a second protection resistor and a second detection resistor; and
- a second switch configured to selectively apply the voltage applied between the second node and the ground to the second voltage divider, in response to a signal output from the control unit,
- wherein the third dividing unit comprises:
- a third voltage divider configured to divide a voltage applied between the third node and the second node, and comprising a third protection resistor and a third detection resistor; and
- a third switch configured to selectively apply the voltage applied between the third node and the second node to the third voltage divider, in response to a signal output from the control unit,
- wherein the control unit is configured to execute a first diagnostic function and a second diagnostic function during an inactive section where the first contactor and the second contactor are controlled in an opened state,
- wherein the first diagnostic function is a function of determining a current leakage of the battery assembly based on the first detection voltage and the second detection voltage, and the second diagnostic function is a function of determining a short circuit of at least one of the first contactor and the second contactor based on the third detection voltage,
- wherein the inactive section comprises a second switching cycle in which the first switch is controlled in an opened state, and the second switch and the third switch are controlled in a closed state, and
- the control unit is configured to record a second pattern comprising values of the third detection voltage measured a plurality of times according to time during the second switching cycle, and determine a short circuit of the second contactor based on the second pattern.

10. A power system comprising the diagnostic apparatus according to claim 9.

11. An electric car comprising the power system according to claim 10.

12. A diagnostic apparatus for a power system that comprises a battery assembly, a first contactor, a second contactor, a first protection capacitor, and a second protection capacitor, the diagnostic apparatus comprising:
- a first voltage dividing unit connected between a ground of the power system and a first node to which a positive electrode of the battery assembly and one end of the first contactor are commonly connected, and configured to generate a first detection voltage by dividing a voltage applied between the first node and the ground;
- a second voltage dividing unit connected between the ground and a second node to which a negative electrode of the battery assembly and one end of the second contactor are commonly connected, and configured to generate a second detection voltage by dividing a voltage applied between the second node and the ground;
- a third voltage dividing unit connected between the second node and a third node to which one end of the first protection capacitor and another end of the first contactor are commonly connected, and configured to generate a third detection voltage by dividing a voltage between the third node and the second node; and
- a control unit configured to control the first contactor, the second contactor, and the first through third voltage dividing units,
- wherein the first voltage dividing unit comprises:
- a first voltage divider configured to divide a voltage applied between the first node and the ground, and comprising a first protection resistor and a first detection resistor; and
- a first switch configured to selectively apply the voltage applied between the first node and the ground to the first voltage divider, in response to a signal output from the control unit, and
- wherein the second voltage dividing unit comprises:
- a second voltage divider configured to divide a voltage applied between the second node and the ground, and comprising a second protection resistor and a second detection resistor; and
- a second switch configured to selectively apply the voltage applied between the second node and the ground to the second voltage divider, in response to a signal output from the control unit,
- wherein the third dividing unit comprises:
- a third voltage divider configured to divide a voltage applied between the third node and the second node, and comprising a third protection resistor and a third detection resistor; and a third switch configured to selectively apply the voltage applied between the third node and the second node to the third voltage divider, in response to a signal output from the control unit, wherein the control unit is configured to execute a first diagnostic function and a second diagnostic function during an inactive section where the first contactor and the second contactor are controlled in an opened state, wherein the first diagnostic function is a function of determining a current leakage of the battery assembly based on the first detection voltage and the second detection voltage, and the second diagnostic function is a function of determining a short circuit of at least one of the first contactor and the second contactor based on the third detection voltage, and wherein the inactive section comprises:

a first switching cycle in which the first switch and the third switch are controlled in a closed state, and the second switch is controlled in an opened state; and a second switching cycle in which the first switch is controlled in an opened state, and the second switch and the third switch are controlled in a closed state, and the control unit is configured to determine that the first contactor and the second contactor are in a normal state when the third detection voltage is gradually decreased while having a positive value during the first switching cycle, and is gradually increased while having a negative value during the second switching cycle.

13. The diagnostic apparatus of claim 12, wherein the control unit is configured to determine that the first contactor and the second contactor are short-circuited due to malfunction when a value of the third detection voltage is maintained constant during the first switching cycle or the second switching cycle.

14. A power system comprising the diagnostic apparatus according to claim 12.

15. An electric car comprising the power system according to claim 14.

* * * * *